United States Patent
Korenstein et al.

(10) Patent No.: US 12,414,278 B2
(45) Date of Patent: Sep. 9, 2025

(54) METHOD FOR PROTECTING IR TRANSMITTING WINDOWS AND DOMES FROM EMI

(71) Applicant: Raytheon Company, Arlington, VA (US)

(72) Inventors: Ralph Korenstein, Natick, MA (US); Catherine Trent, Allen, TX (US)

(73) Assignee: Raytheon Company, Arlington, VA (US)

( * ) Notice: Subject to any disclaimer, the term of this patent is extended or adjusted under 35 U.S.C. 154(b) by 1359 days.

(21) Appl. No.: 17/032,793

(22) Filed: Sep. 25, 2020

(65) Prior Publication Data

US 2025/0008715 A1    Jan. 2, 2025

Related U.S. Application Data

(60) Provisional application No. 62/906,263, filed on Sep. 26, 2019.

(51) Int. Cl.
| | |
|---|---|
| *H05K 9/00* | (2006.01) |
| *C23C 14/14* | (2006.01) |
| *C23C 14/48* | (2006.01) |
| *G02B 1/11* | (2015.01) |
| *G02B 1/14* | (2015.01) |
| *G02B 5/20* | (2006.01) |

(52) U.S. Cl.
CPC ........... *H05K 9/0084* (2013.01); *C23C 14/14* (2013.01); *C23C 14/48* (2013.01); *G02B 5/204* (2013.01); *G02B 5/208* (2013.01); *G02B 1/11* (2013.01); *G02B 1/14* (2015.01)

(58) Field of Classification Search
None
See application file for complete search history.

(56) References Cited

U.S. PATENT DOCUMENTS

| | | | |
|---|---|---|---|
| 4,704,339 | A | 11/1987 | Green et al. |
| 4,939,043 | A | 7/1990 | Biricik et al. |
| 5,122,424 | A | 6/1992 | Chaffin, III |
| 5,173,443 | A | 12/1992 | Biricik et al. |
| 6,007,908 | A | 12/1999 | Reece et al. |
| 6,160,661 | A | 12/2000 | Klocek et al. |
| 7,147,759 | B2 | 12/2006 | Chistyakov |

(Continued)

FOREIGN PATENT DOCUMENTS

| | | |
|---|---|---|
| CN | 102610690 | 7/2012 |
| CN | 106435493 | 2/2017 |

(Continued)

OTHER PUBLICATIONS

Glossary Definition LWIR (Long-Wave Infrared) from https://www.infinitioptics.com/glossary/lwir-long-wave-infrared (Year: 2019).*

(Continued)

*Primary Examiner* — David Sample
(74) *Attorney, Agent, or Firm* — Schwegman Lundberg & Woessner, P.A.

(57) ABSTRACT

Transparent IR conductive (TIRC) coatings used for EMI protection of, for example, longwave IR windows and domes are disclosed. In some non-limiting embodiments, the TIRC coating may be a BaCuSF coating. Related systems and methods are also disclosed.

20 Claims, 5 Drawing Sheets

(56) References Cited

U.S. PATENT DOCUMENTS

| | | | |
|---|---|---|---|
| 7,161,173 | B2 | 1/2007 | Burgener, II et al. |
| 8,044,477 | B1 | 10/2011 | Zhong et al. |
| 9,123,508 | B2 | 9/2015 | Chistyakov et al. |
| 9,952,355 | B1 | 4/2018 | Schwartz |
| 10,692,707 | B2 | 6/2020 | Weichart et al. |
| 10,741,649 | B2 | 8/2020 | Sachet et al. |
| 2002/0096684 | A1* | 7/2002 | Brandes .................. H10D 1/47 257/E31.049 |
| 2003/0077401 | A1 | 4/2003 | Dodonov et al. |
| 2003/0201164 | A1 | 10/2003 | Johnson et al. |
| 2004/0235214 | A1 | 11/2004 | Burgener et al. |
| 2006/0118406 | A1 | 6/2006 | Delahoy et al. |
| 2010/0055826 | A1 | 3/2010 | Zhong et al. |
| 2010/0072465 | A1 | 3/2010 | Frantz et al. |
| 2010/0264016 | A1 | 10/2010 | Anders et al. |
| 2010/0282319 | A1 | 11/2010 | Taliani et al. |
| 2011/0067998 | A1 | 3/2011 | Barry |
| 2012/0000765 | A1 | 1/2012 | Halloran |
| 2012/0000767 | A1 | 1/2012 | Halloran |
| 2012/0067421 | A1 | 3/2012 | Shao et al. |
| 2012/0080306 | A1 | 4/2012 | Zhong et al. |
| 2012/0164051 | A1 | 6/2012 | Bruns et al. |
| 2012/0180858 | A1 | 7/2012 | Zhong et al. |
| 2012/0205540 | A1 | 8/2012 | Ravichandran et al. |
| 2012/0223230 | A1 | 9/2012 | Ravichandran et al. |
| 2015/0315697 | A1 | 11/2015 | Chistyakov et al. |
| 2015/0380600 | A1 | 12/2015 | Buller et al. |
| 2017/0022368 | A1 | 1/2017 | Goela et al. |
| 2018/0290896 | A1 | 10/2018 | Ravichandran et al. |
| 2021/0123131 | A1 | 4/2021 | Tsai et al. |
| 2022/0244431 | A1 | 8/2022 | Riedel et al. |

FOREIGN PATENT DOCUMENTS

| | | | |
|---|---|---|---|
| CN | 104862653 | | 7/2017 |
| CN | 107119323 | | 9/2017 |
| CN | 108410460 | | 8/2018 |
| CN | 108754442 | | 11/2018 |
| CN | 109839680 | | 6/2019 |
| CN | 110205597 | | 9/2019 |
| CN | 108330440 | | 6/2020 |
| CN | 109097753 | | 8/2020 |
| CN | 113073300 | | 7/2021 |
| CN | 114645251 | | 6/2022 |
| CN | 115433906 | | 8/2023 |
| EP | 4035211 | | 8/2022 |
| JP | S61133825 | | 6/1986 |
| JP | S63201078 | | 8/1988 |
| JP | 2018163339 | | 10/2018 |
| JP | 2022549855 | | 11/2022 |
| JP | 7534056 | | 8/2024 |
| RO | 129878 | | 11/2014 |
| TW | I381063 | | 1/2013 |
| WO | 2010051282 | | 5/2010 |
| WO | 2015199624 | A1 | 12/2015 |
| WO | 2018083480 | | 5/2018 |
| WO | 2021062162 | | 4/2021 |

OTHER PUBLICATIONS

H. Yanagi et al: "P-type conductivity in transparent oxides and sulfide fluorides," Journal of Solid State Chemistry, vol. 175, No. 1, (2003), pp. 34-38.

"Japanese Application Serial No. 2022-518968, Notification of Reasons for Refusal mailed Feb. 6, 2024", w English Translation, 8 pgs.

"Japanese Application Serial No. 2022-518968, Response filed Apr. 22, 2024 to Notification of Reasons for Refusal mailed Feb. 6, 2024", With English Machine Translation, 17 pgs.

"International Application Serial No. PCT US2020 052731, Written Opinion mailed Dec. 17, 2020", 7 pgs.

"International Application Serial No. PCT US2020 052731, International Preliminary Report on Patentability mailed Jul. 4, 2022", 9 pgs.

"Japanese Application Serial No. 2022-518968, Notification of Reasons for Refusal mailed Apr. 4, 2023", w English translation, 4 pgs.

"Japanese Application Serial No. 2022-518968, Notification of Reasons for Refusal mailed Aug. 8, 2023", w English translation, 6 pgs.

"European Application Serial No. 20789394.2, Response to Communication pursuant to Rules 161(1) and 162 EPC filed Sep. 26, 2022", 13 pgs.

"European Application Serial No. 20789394.2, Communication Pursuant to Article 94(3) EPC mailed Mar. 29, 2023", 6 pgs.

"European Application Serial No. 20789394.2, Noting of loss of rights pursuant to Rule 112(1) EPC mailed Oct. 31, 2023", 2 pgs.

"Application Serial No. 18 604, 125, Restriction Requirement mailed Oct. 25, 2024", 6 pgs.

"Application Serial No. 18 604, 125, Response filed Dec. 19, 2024 to Restriction Requirement mailed Oct. 25, 2024", 6 pgs.

"Application Serial No. 18 604, 125, Non Final Office Action mailed Mar. 11, 2025", 14 pgs.

Derwent, Abstract WO 2021062162, (2021), 4 pages.

Greczynski, G., "Metal-ion subplantation: A game changer for controlling nanostructure and phase formation during film growth by physical vapor deposition", J. Appl. Phys. Vol. 127, Issue 18, (May 14, 2020), 21 pgs.

Li, X., "Toward energy-efficient physical vapor deposition: Routes for replacing substrate heating during magnetron sputter deposition by employing metal ion irradiation", Surface and Coatings Technology, vol. 415, (Jun. 15, 2021), 10 pgs.

Zhuk, Siarhei, "Molybdenum incorporated Cu1.69ZnSnS4 kesterite photovoltaic devices with bilayer microstructure and tunable optical-electronic properties", Journal of Solar Energy 194, (2019), 11 pgs.

"International Application Serial No. PCT US2025 019579, International Search Report mailed Jun. 30, 2025", 4 pgs.

"International Application Serial No. PCT US2025 019579, Written Opinion mailed Jun. 30, 2025", 6 pgs.

"U.S. Appl. No. 18/604,125, Final Office Action mailed Jul. 8, 2025", 15 pgs.

* cited by examiner

METHOD FOR PROTECTING IR TRANSMITTING WINDOWS AND DOMES FROM EMI

CROSS-REFERENCE TO RELATED APPLICATION

This application claims priority under 35 U.S.C. § 119(e) to U.S. Provisional Patent Application Ser. No. 62/906,263, filed on Sep. 26, 2019, the entire disclosure of which is hereby incorporated herein by reference in its entirety for all purposes.

FIELD OF THE TECHNOLOGY

Aspects relate generally to techniques for providing protection from electromagnetic interference (EMI).

BACKGROUND

Electro-optical and infrared (EO/IR) sensors provide situational awareness in various military, industrial, and civilian applications. EO/IR sensors may include IR transmitting apertures, such as windows and domes. EO/IR apertures protect the sensors from radio-frequency (RF) interference. Electromagnetic interference (EMI) grids are conventionally employed across the aperture surfaces to reflect undesired RF energy in order to afford this protection. EMI grids are typically made of metal or carbon nanotube (CNT).

SUMMARY

In accordance with one or more aspects, an electro-optical or infrared (EO/IR) sensor is disclosed. The sensor may comprise an aperture having a substrate, and a transparent IR conductive (TIRC) coating applied to a surface of the substrate.

In accordance with one or more aspects, a system may comprise an EO/IR sensor as described herein.

In accordance with one or more aspects, a longwave IR window or dome may comprise a TIRC coating effective to provide EMI protection.

In accordance with one or more aspects, a method of protecting an EO/IR sensor from RF interference is disclosed. The method may comprise depositing a TIRC coating on an aperture of the EO/IR sensor.

The disclosure contemplates all combinations of any one or more of the foregoing aspects and/or embodiments, as well as combinations with any one or more of the embodiments set forth in the detailed description and any examples.

BRIEF DESCRIPTION OF THE DRAWINGS

Certain illustrative features and examples are described below with reference to the accompanying figures in which.

Figure 1B:
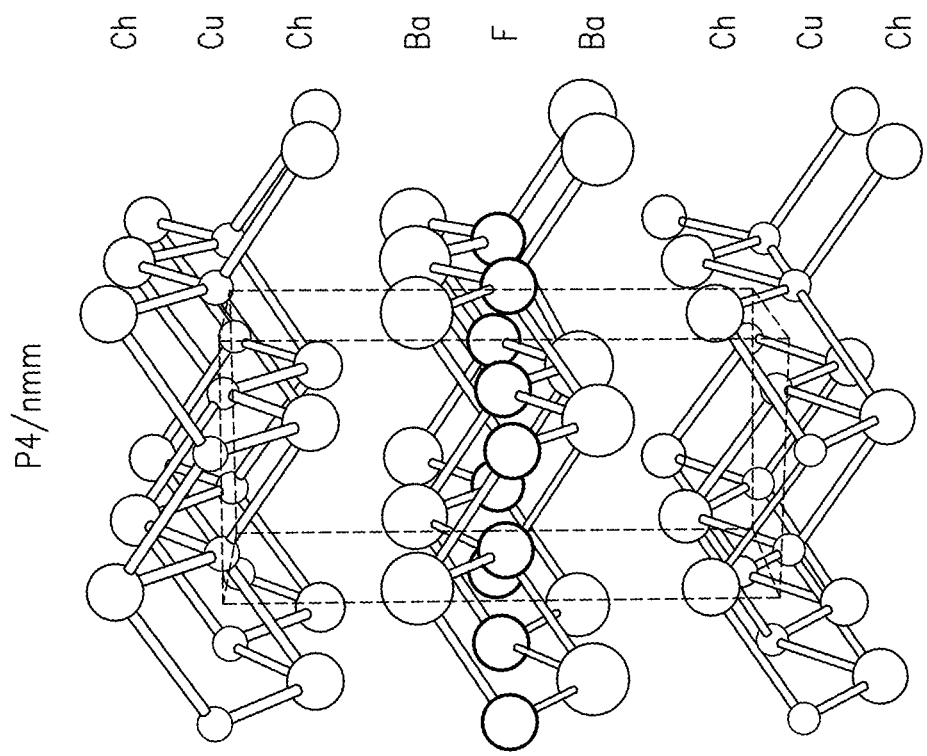
FIG. 1B presents the thin film cross-section (top) and the microstructure (bottom) of a TIRC coating in accordance with one or more embodiments.

It will be recognized by the person of ordinary skill in the art, given the benefit of this disclosure, that the figures are purely for illustrative purposes. Other features may be present in the embodiments disclosed herein without departing from the scope of the description.

DETAILED DESCRIPTION

In accordance with one or more embodiments, an EMI protection technology is disclosed. A transparent IR conductive (TIRC) coating may improve EMI optical and RF performance. A TIRC coating may be used for EMI protection, e.g. of longwave IR windows and domes. Beneficially, such coatings may be associated with durability, no obscuration, no diffraction, increased RF isolation, and increased optical transmission compared to conventional metal or CNT grids. A TIRC coating may not require any fine features and may be scaled to large areas in terms of fabrication. The disclosed TIRC coatings may be easier to apply to EO/IR apertures, especially domes. Cost savings may also be recognized. The disclosed EMI protection technology may enable large EO/IR missile and aircraft systems since the thin films may increase transmission of EO/IR energy to the sensors, reduce imaging issues associated with EMI grids, and reduce aperture costs due to simplified fabrication and production approaches.

In accordance with one or more embodiments, a TIRC coating may be applied to an EO/IR aperture substrate. In some embodiments, the substrate may be an EO/IR window or dome. The EO/IR window may be of any desired diameter and/or depth. In at least some embodiments, the substrate may be a zinc sulfide (ZnS) material.

In accordance with one or more embodiments, the TIRC coating may be largely based on a BaCuSF materials system. In some preferred embodiments, the TIRC coating may be a BaCuSF film. The BaCuSF composition may be adjusted to modify its electrical and/or optical properties. For example, partial substitution of K for Ba may increase electrical conductivity. Substitution of Se and/or Te for S may alter the band gap, carrier mobility, and optical transmittance.

In accordance with one or more embodiments, the TIRC coating may be a conductive and IR transparent film. In some non-limiting embodiments, the film may be made of a material represented by the formula: BaCuChF, wherein Ch=S, Se, or Te. In some embodiments, barium may generally provide charge neutrality. Dopants may be strategically introduced, for example, in order to provide desired electrical characteristics. In some non-limiting embodiments, potassium, lithium, and/or sodium may be dopants for barium. In at least some embodiments, barium may be partially substituted with potassium, lithium, and/or sodium.

In accordance with one or more embodiments, coating thickness may impact various performance parameters and may be optimized. In some non-limiting embodiments, a TIRC coating may have a thickness of about 0.5 µm to about 5 µm. Likewise, grain size associated with the coating may also impact various performance parameters and may be optimized. In some non-limiting embodiments, a BaCuSF film may have a grain size of less than about 100 nm. In at least some specific non-limiting embodiments, a BaCuSF film may have a grain size of about 10 nm to about 100 nm. Grain size may effect electrical conductivity and may be adjusted via altering annealing techniques.

Figure 1A:
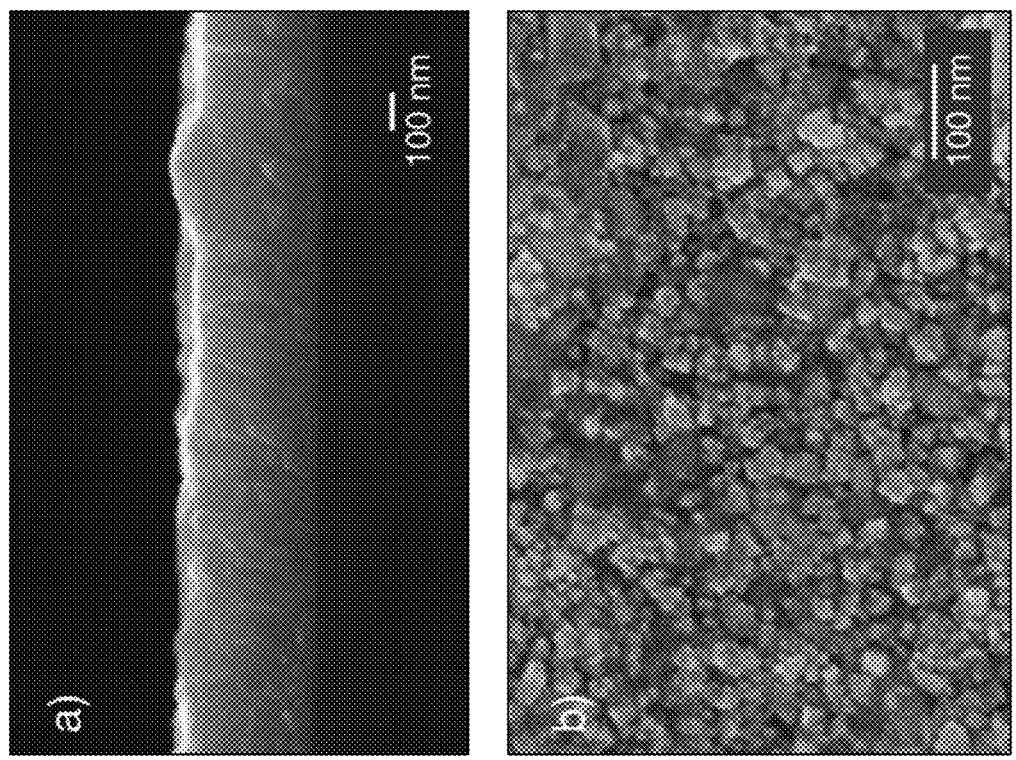
FIG. 1A illustrates the crystal structure of a TIRC coating in accordance with one or more embodiments.

FIG. 1A illustrates the crystal structure of a TIRC coating in accordance with one or more non-limiting embodiments. FIG. 1B presents the thin film cross-section (top) and the microstructure (bottom) of a TIRC coating in accordance with one or more non-limiting embodiments.

In accordance with one or more embodiments, ion implantation may be used to increase electrical conductivity of the coating. Ion implantation techniques are conventionally known and may be implemented. In some non-limiting embodiments, $Li^+$, $Na^+$, and/or $H^+$ ions may be implanted.

In accordance with one or more embodiments, the TIRC coating may be deposited onto the substrate via various conventional coating techniques. In some embodiments, a nanofabrication technique may be implemented to include: magnetron sputtering, chemical vapor deposition and ion deposition. In at least some embodiments, a TIRC coating may be deposited onto a ZnS window or dome via a variety of deposition techniques. In certain non-limiting embodiments, a BaCuSF film may be deposited onto a ZnS window or dome via magnetron sputtering. The TIRC coating may be applied in a single pass or in an iterative layering approach.

In accordance with one or more embodiments, a further coating may be applied to the TIRC coating. The further coating may be formulated and deposited to provide one or more desired properties such as but not limited to protection, durability, and antireflection.

Figure 2:
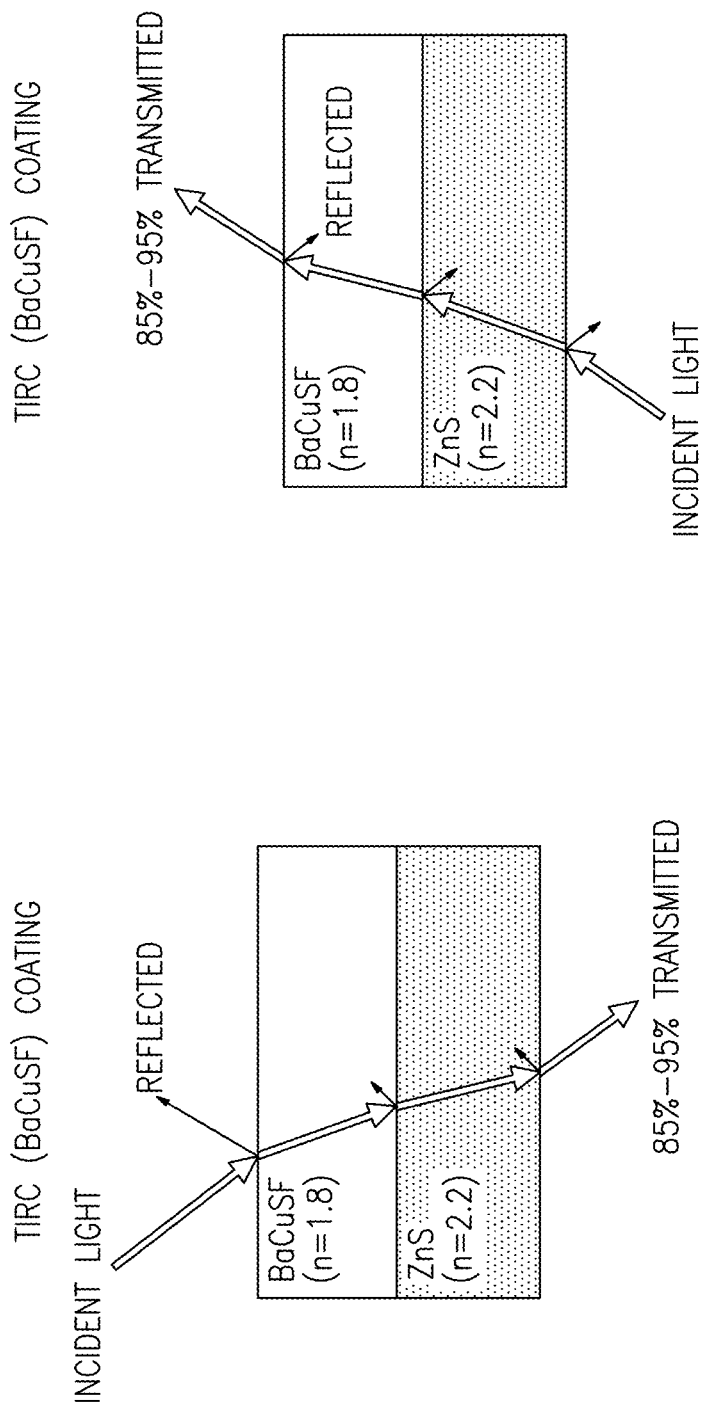
FIG. 2 illustrates transmission rates of TIRC coatings in accordance with one or more embodiments.

In accordance with one or more embodiments, resulting films can be characterized for light transmittance, electrical conductivity, and/or RF performance. In some embodiments, a TIRC coating may operate across the entire IR spectrum (SWIR-LWIR). A TIRC coating may transmit across the IR spectrum from short wave infrared (SWIR; 1-3 μm) to long-wave infrared (vis-LWIR; 8-12 μm). In some embodiments, a TIRC coating may provide infrared transmittance beyond about 12 μm with good electrical conductivity. In at least some embodiments, a TIRC coating may be characterized by an IR transmission of at least about 85% regardless of angle of incidence. FIG. 2 illustrates a transmission level of at least about 85% for a BaCuSF TIRC coating on a ZnS substrate at different incident light directions. In comparison, a metal or CNT grid may be associated with a transmission level of about 50% to about 70% on a ZnS substrate.

In accordance with one or more embodiments, a TIRC coating may be characterized by a predetermined RF isolation level at an RF frequency of about 10 GHz or higher. The predetermined RF isolation level may be a desired RF isolation level based on one or more parameters.

Optical, electrical conductivity, and RF measurements may be used to adjust and optimize the BaCuSF composition for optimal performance.

In accordance with one or more embodiments, TIRC coatings may be used for EMI shielding in EO/IR systems involving multi-spectral sensing. Potential applications may include various aircraft, military, and space-based programs. For example, a TIRC coating may find utility in Electro-Optical and Infrared sensor systems including high energy laser (HEL) EMI shielding, IR transparent frequency selective surfaces (FSSs), antennas, and electro-static protection applications.

The function and advantages of these and other embodiments will be more fully understood from the following examples. The examples are intended to be illustrative in nature and are not to be considered as limiting the scope of the materials, systems, and methods discussed herein.

Example 1

The performance of the disclosed TIRC coatings was compared to the performance of other traditional EMI treatments to include: metal grids and conductive coatings through experimentation and modeling. Table 1 summarizes select comparative RF isolation and IR transmission loss data.

TABLE 1

| Comparative Data | | | |
|---|---|---|---|
| | Metal Grid[2] | ITO[1] | TIRC[3] |
| Pattern (Thickness) | Grid (2 μm) | Sheet (0.3 μm) | Sheet (5 μm) |
| Sheet Resistance (Ω/sq) | 0.1 | 2.5 | 2.5 |
| RF Isolation @10 GHz (dB) | −38[2] | −38*[2] | −38*[2] |
| RF Isolation @18 GHz (dB) | −25[2] | −38*[3] | −38*[3] |
| IR Transmission Loss @ 0° | 20-40%[2] | 100%[1] | <0.01%*[3] |
| IR Transmission Loss @ 75° | 30-60%[2] | 100%[1] | <0.01%*[3] |
| Est. Cost/window [12" × 12"] ($) | 70K[2] | 5-10K[3] | 5-10K[3] |

*Denotes simulation predictions
[1]Worse than metal grids
[2]Similar to metal grids
[3]Goal for a "Broadband ITO"

With respect to RF isolation, all technologies performed comparatively at RF frequencies of less than about 10 GHz. At RF frequencies of greater than about 10 GHz, the TIRC coating outperforms traditional EMI treatments.

With respect to optical transmission, the TIRC film outperformed all of the other EMI technologies. The TIRC film transmitted almost 100% of the incoming radiation. The transmission loss was even higher for grid technologies at higher angles of incidence. ITO is known to not transmit beyond 1.5 μm.

Example 2

Figure 3:
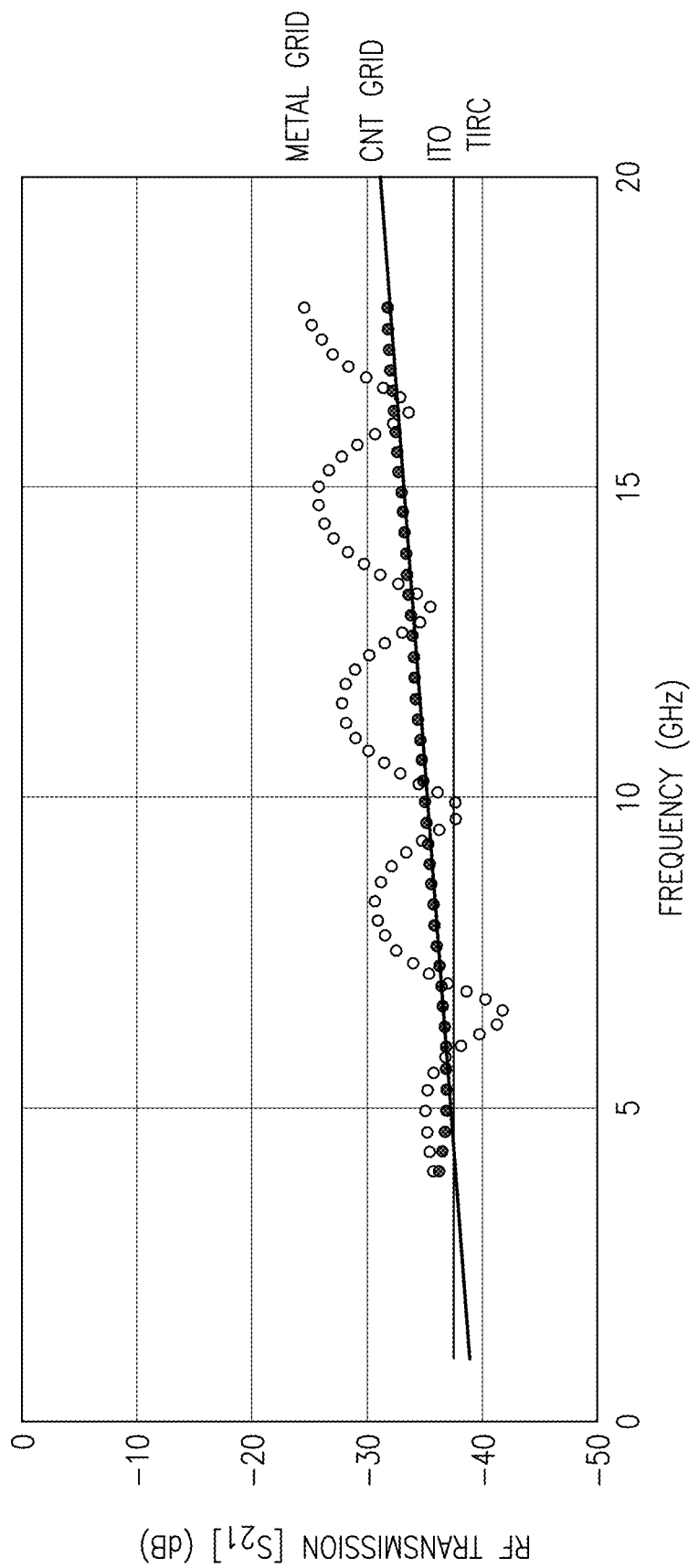
FIGS. 3-5 present transmittance data in connection with TIRC coatings as discussed in accompanying Example 2.
Figure 4:
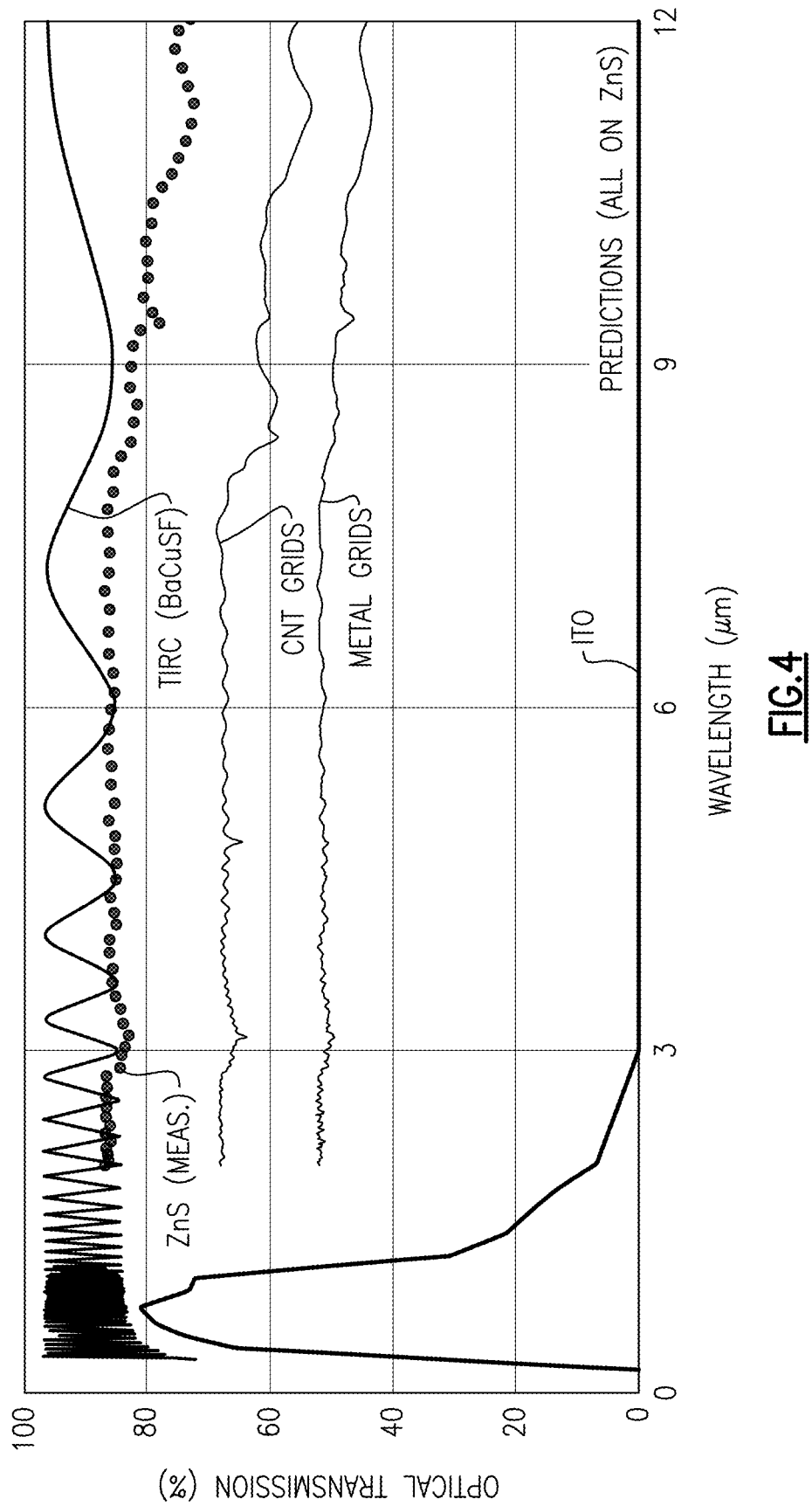
Figure 5:
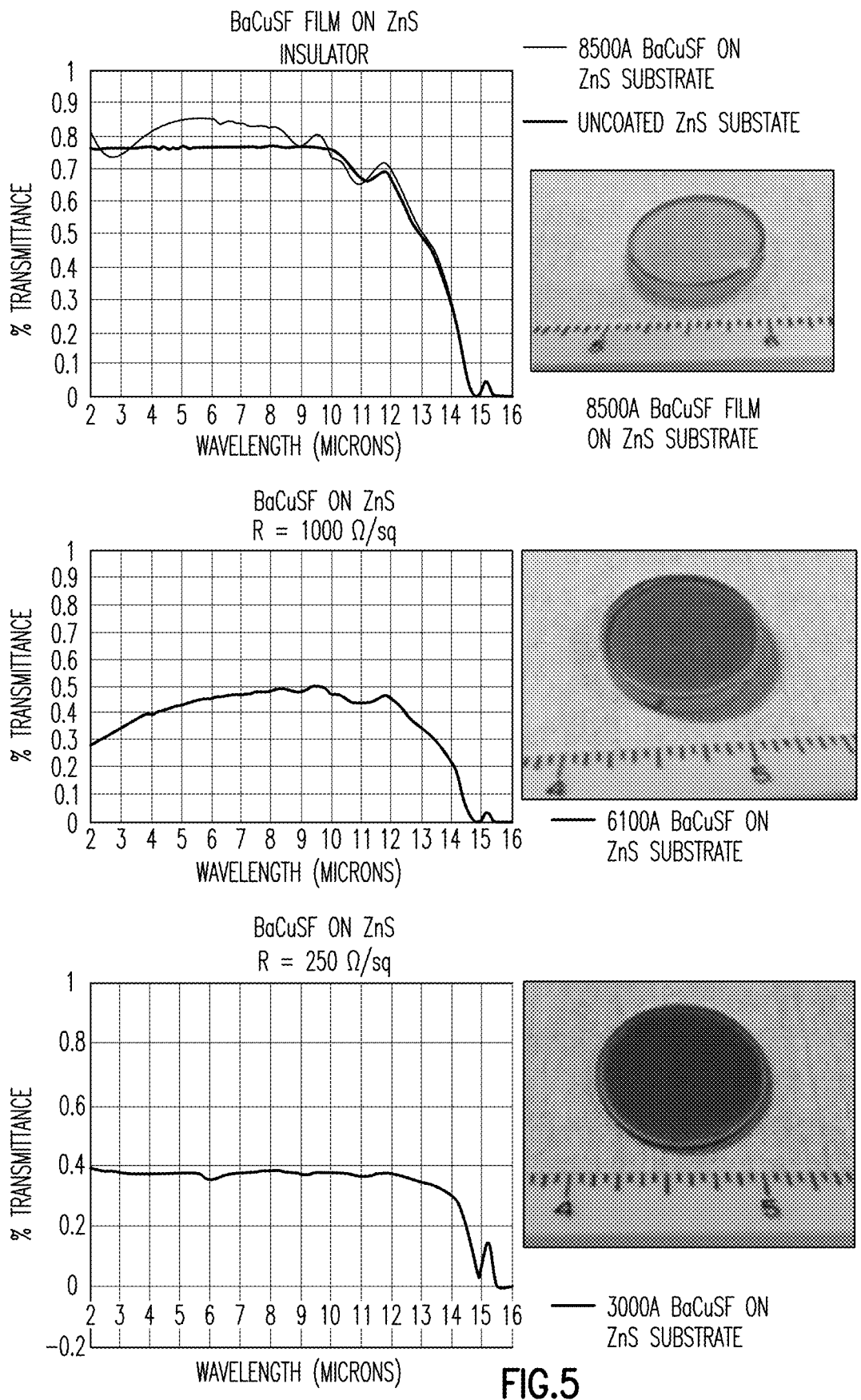

TIRC coatings in accordance with one or more embodiments were tested at varying film resistances. Transmittance spectra of several TIRC coatings deposited on ZnS substrates are presented in FIGS. 3-5. As the film resistance decreased (and the electrical conductivity increased), the transmittance of the coating also decreased. Further optimization will yield TIRC coatings which maintain both high optical transmittance and high electrical transmittance.

The phraseology and terminology used herein is for the purpose of description and should not be regarded as limiting. As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure and are intended to be within the scope of the invention. Accordingly, the foregoing description and drawings are by way of example only.

Those skilled in the art should appreciate that the parameters and configurations described herein are exemplary and that actual parameters and/or configurations will depend on the specific application in which the disclosed methods and materials are used. Those skilled in the art should also recognize or be able to ascertain, using no more than routine experimentation, equivalents to the specific embodiments disclosed.

What is claimed is:

1. An electro-optical or infrared (EO/IR) sensor, comprising:
    an aperture having a substrate;
    a coating applied to a surface of the substrate, wherein the coating has:
        a thickness of between 0.5 μm and 5 μm;
        a radio frequency (RF) isolation at a RF level of 10 GHz or higher; and
        an IR transmission level of at least about 85%
        wherein the coating comprises the formula BaCuChF, wherein Ch is S, Se, or Te.
2. The EO/IR sensor of claim 1, wherein the coating is a thin film.
3. The EO/IR sensor of claim 1, wherein the coating is characterized by a grain size of less than about 100 nm.
4. The EO/IR sensor of claim 3, wherein the coating is characterized by a grain size of between about 10 nm and about 100 nm.
5. The EO/IR sensor of claim 1, wherein Ba may be partially substituted with Li, Na, or K.
6. The EO/IR sensor of claim 1, wherein the coating comprises BaCuSF.
7. The EO/IR sensor of claim 1, wherein the coating further comprising implanted ions.
8. The EO/IR sensor of claim 7, wherein the implanted ions comprise $Li^+$, $Na^+$, and/or $H^+$.
9. The EO/IR sensor of claim 1, wherein the coating is characterized by an IR transmission of at least about 85%.
10. The EO/IR sensor of claim 1, further comprising a protective or antireflective coating on the coating.
11. The EO/IR sensor of claim 1, wherein the aperture substrate comprises any optical substrate.
12. A system comprising an EO/IR sensor of claim 1.
13. A method of protecting an EO/IR sensor from RF interference, comprising:
    depositing a coating on an aperture of the EO/IR sensor, wherein the coating is deposited such that the coating has:
        a thickness of between 0.5 μm and 5 μm;
        a radio frequency (RF) isolation at a RF level of 10 GHz or higher; and
        an IR transmission level of at least about 85%
        wherein the coating comprises the formula BaCuChF, wherein Ch is S, Se, or Te.
14. The method of claim 13, wherein Ba may be partially substituted with Li, Na, or K.
15. The method of claim 13, wherein the coating comprises BaCuSF.
16. The method of claim 13, wherein deposition is performed via a nanofabrication technique.
17. The method of claim 13, wherein the coating is deposited in a single pass.
18. The method of claim 13, wherein the coating is deposited on any optical substrate of the aperture.
19. The method of claim 13, further comprising implanting ions into the coating.
20. The method of claim 13, further comprising depositing a protective, durable coating on the coating.

* * * * *